United States Patent
Kim et al.

[11] Patent Number: 6,090,455
[45] Date of Patent: Jul. 18, 2000

[54] METHOD FOR FORMING SBT FERROELECTRIC THIN FILM

[75] Inventors: Ho Gi Kim, Seoul; Won Jae Lee; Soon Gil Yoon, both of Taejeon; Joon Hyung Ahn, Seoul, all of Rep. of Korea

[73] Assignee: Korea Advanced Institute of Science and Technology, Taejeon, Rep. of Korea

[21] Appl. No.: 09/128,938

[22] Filed: Aug. 5, 1998

[30] Foreign Application Priority Data

Aug. 27, 1997 [KR] Rep. of Korea ..................... 97-41508

[51] Int. Cl.[7] ..................................................... H05H 1/20
[52] U.S. Cl. ..................... 427/573; 427/126.3; 427/255; 427/255.32; 427/255.395; 427/576
[58] Field of Search ..................... 427/569, 126.3, 427/573, 252, 255.28, 255.32, 255.395, 576

Primary Examiner—Bernard Pianalto
Attorney, Agent, or Firm—Greer, Burns & Crain, Ltd.

[57] ABSTRACT

A method for forming SBT ferroelectric thin film. $Sr(C_5F_6HO_2)_2$, $Bi(C_6H_5)_3$ and $Ta(C_2H_5O)_5$ are used as the precursors of Sr, Bi and Ta and bubbled at a temperature of 110–130° C., 140–160° C., and 120–140° C., respectively. The deposition of the precursors on a substrate is carried out at 500–550° C. in plasma by using an RF power of 100–150 W. Having a residual polarity (Pr) of 15 $\mu C/cm^2$ or higher and a coercive electric field (Ec) of 50 kV/cm or less and, the SBT ferroelectric thin film does not show a fatigue phenomenon until $1 \times 10^{11}$ cycles as measured under 6V bipolar square pulse in the structure comprising Pt upper and lower electrodes and thus, can be applied for non-volatile memory devices.

4 Claims, 3 Drawing Sheets

METHOD FOR FORMING SBT FERROELECTRIC THIN FILM

BACKGROUND OF THE INVENTION

1. Field of the Invention

The present invention relates to a method for forming an SBT ($SrBi_2Ta_2O_9$) ferroelectric thin film. More particularly, the present invention relates to a novel method by which an SBT ferroelectric thin film superior in ferroelectric characteristics can be formed at such a low temperature as not to affect semiconductor device processes.

2. Description of the Prior Art

Usually, the formation of SBT thin films has been researched through various techniques, including sol-gel method, MOD method, laser ablation method, etc. Of them, the most popular is the MOCVD (Metalorganic Chemical Vapor Deposition) method. However, the current forming processes of SBT thin film in use, including MOCVD method, have a serious problem of being high in temperature. That is, a process temperature of about 750–800° C. has been a significant obstacle in proceeding with conventional semiconductor device processes. To overcome this obstacle, much effort has been made. For instance, MOCVD-SBT thin films, which are currently evaluated to show optimal properties, are deposited at a temperature of 500–600° C. but their ferroelectric characteristics are not expressed without carrying out a subsequent thermal treatment at a temperature of 750° C. or higher (see, Li et al. Appl. Phys. Lett., 68(5), 616 (1996); Yang et al., Materials Letters, 30, 245–248 (1997)).

SUMMARY OF THE INVENTION

Extensive studies on an SBT thin film having excellent ferroelectric properties and having no deleterious influence on semiconductor device processes, repeated by the present inventors, resulted in the finding that a combination of $Sr(C_5F_6HO_2)_2$, $Bi(C_6H_5)_3$ and $Ta(C_2H_5O)_5$ can be deposited with plasma to form an SBT thin film superior in ferroelectric properties, at a temperature lower than that of conventional methods by 200° C. or more.

It is therefore an object of the present invention to provide a method for forming an SBT thin film of superior ferroelectric characteristics without deleteriously affecting semiconductor device processes.

In accordance with the present invention, there is provided a method for forming an SBT ferroelectric thin film in which $Sr(C_5F_6HO_2)_2$, $Bi(C_6H_5)_3$ and $Ta(C_2H_5O)_5$ are bubbled at a temperature of 110–130° C., 140–160° C., and 120–140° C., respectively, and subjected to deposition at a temperature of 500–550° C. by generating plasma at an RF power of 100–150 W.

The SBT ferroelectric thin film of the invention shows a residual polarity (Pr) of 15 $\mu C/cm^2$ or higher and a coercive electric field (Ec) of 50 kV/cm or less and does not show a fatigue phenomenon until $1\times10^{11}$ cycles as measured under 6V bipolar square pulse in the structure comprising Pt upper and lower electrodes.

BRIEF DESCRIPTION OF THE DRAWINGS

Other objects and aspects of the invention will become apparent from the following description of embodiments with reference to the accompanying drawings in which.

DETAILED DESCRIPTION OF THE INVENTION

In the present invention, $Sr(C_5F_6HO_2)_2$ is used as an Sr source in order to form an SBT ferroelectric thin film, $Bi(C_6H_5)_3$ as a Bi source, and $Ta(C_2H_5O)_5$ as a Ta source. These sources are carried by Ar gas to a reactor which is, then, charged with oxygen. After plasma is generated within the reactor, when the temperature of the chamber is raised to 500–600° C., a clear crystalline phase starts to form at about 550° C. with ferroelectric characteristics.

In accordance with the present invention, an SBT ($SrBi_2Ta_2O_9$) ferroelectric thin film is formed as described below.

Within a chamber which is made highly vacuous ($10^{-3}$ torr) by a vacuum pump, a substrate is heated up to 550° C. Each of the bubblers for material sources is heated to a temperature suitable to evaporate each of the sources in the chamber while the sources are carried to the chamber by argon gas. Oxygen gas as reacting gas is fed into the chamber which is, then, maintained at an operating pressure enough to generate plasma. For the deposition of the sources, plasma is generated by an RF power generator. At a predetermined time after the initiation of evaporation, a valve is closed to stop the evaporation. Slow cooling within the chamber gives an SBT thin film.

The reaction conditions useful to form an SBT ferroelectric thin film according to the present invention are listed in Table 1 below.

TABLE 1

| Classification | Conditions |
| --- | --- |
| Deposition Temp. | 500–550° C. |
| Operating Press. | 2 torr |
| Substrate | Pt/Ti/SiO$_2$/Si |
| RF Power | 100–150 W |
| Bubbling Temp. of Sr(C$_5$F$_6$HO$_2$)$_2$ | 110–130° C. |
| Flow Rate of Ar gas for Sr(C$_5$F$_6$HO$_2$)$_2$ | 80 sccm |
| Bubbling Temp. of Bi(C$_6$H$_5$)$_3$ | 140–160° C. |
| Flow Rate of Ar gas for Bi(C$_6$H$_5$)$_3$ | 80 sccm |
| Bubbling Temp. of Ta(C$_2$H$_5$O)$_5$ | 120–140° C. |
| Flow Rate of Ar gas for Ta(C$_2$H$_5$O)$_5$ | 15 sccm |
| Flow Rate of oxygen gas | 200 sccm |

A detailed description will be given of the ferroelectric and hysteresis characteristics of the SBT thin film according to the present invention, with reference to the drawings.

Figure 1:
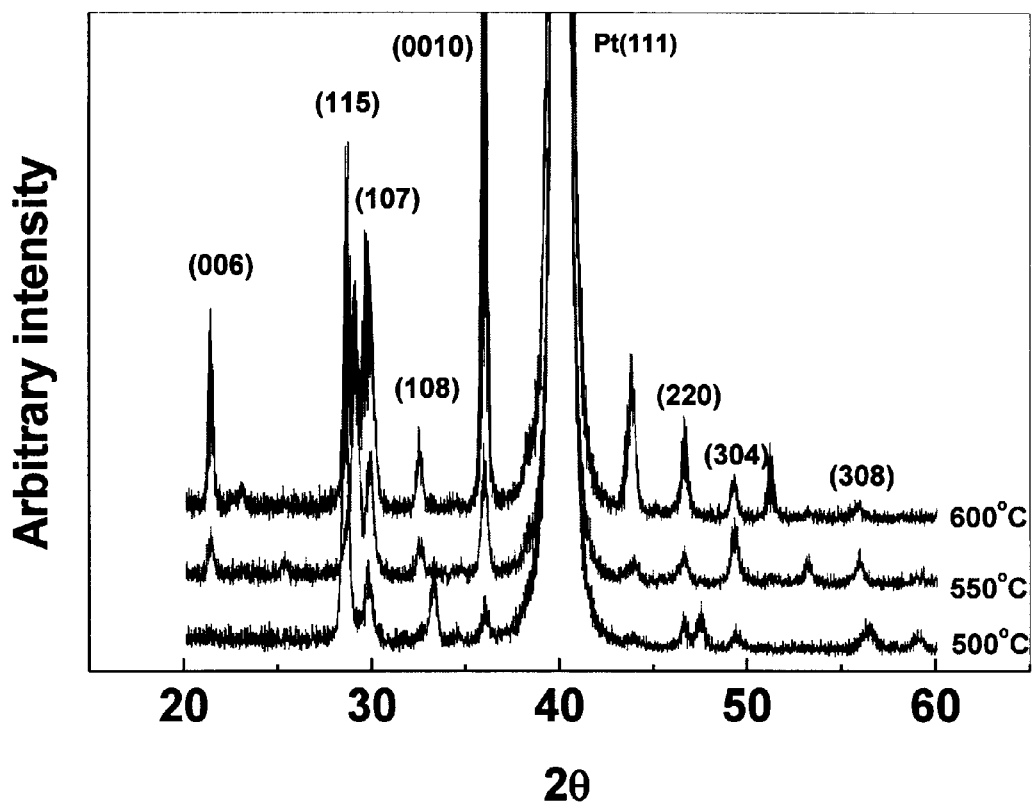
FIG. 1 shows the formation of SBT thin films according to temperatures.

FIG. 1 shows the phase formation of SBT thin films according to deposition temperatures. As shown in this figure, the intensity of the peaks in the direction of (001), which are of preference orientation in the C axis direction, increases with the deposition temperature.

Figure 2:
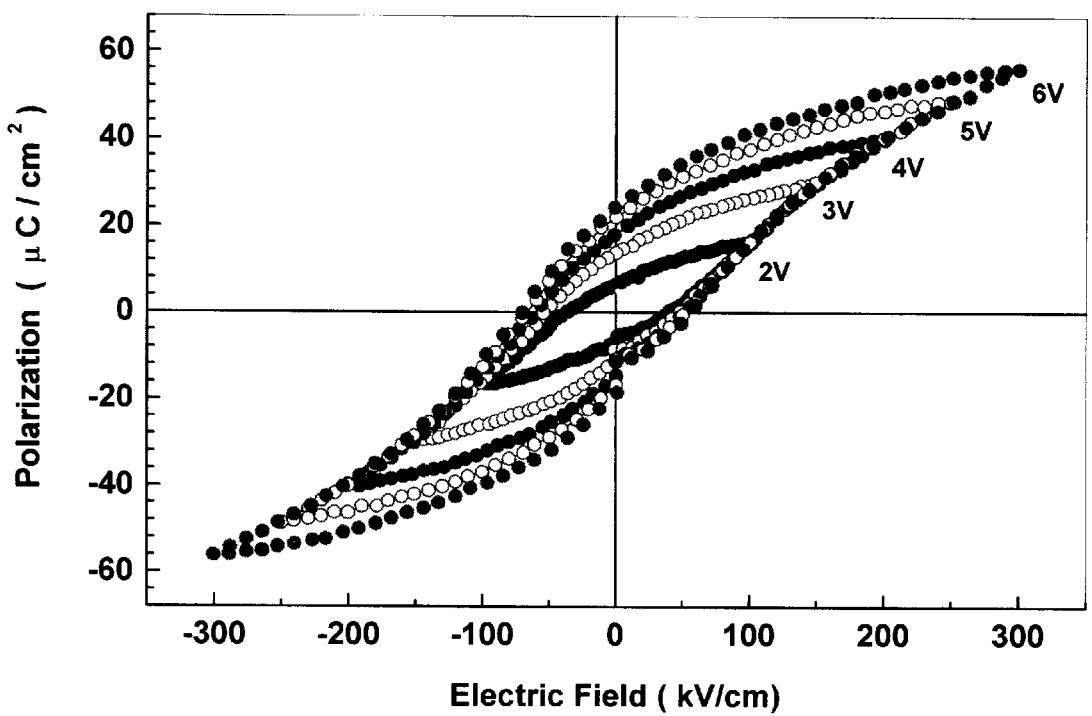
FIG. 2 shows the hysteresis curves of an SBT thin film deposited at 550° C. according to the invention.

Referring to FIG. 2, there are shown P-E hysteresis curves for an SBT thin film 190 nm thick, deposited at 550° C. From 3 V, the thin film is saturated with a complete P-E curve, as seen in the figure. At the same applied voltage, the thin film has a residual polarity (Pr) of approximately 15 $\mu C/Cm^2$ and a coercive electric field (Ec) of approximately 50 kV/cm.

Figure 3:
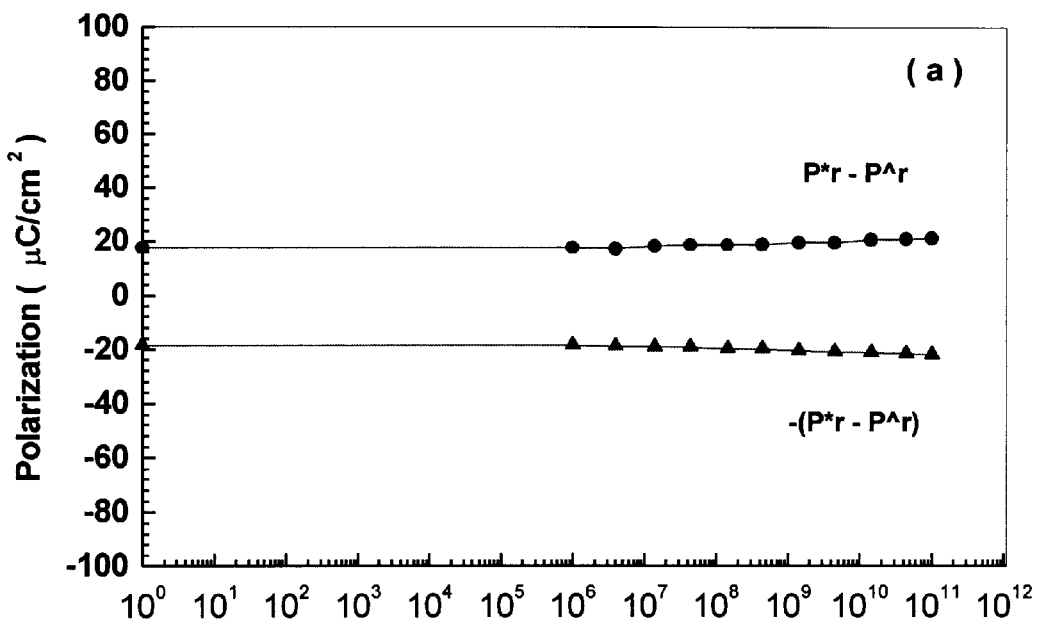
FIG. 3 shows the fatigue characteristics of an SBT thin film deposited at 550° C. according to the invention.
Figure 3:
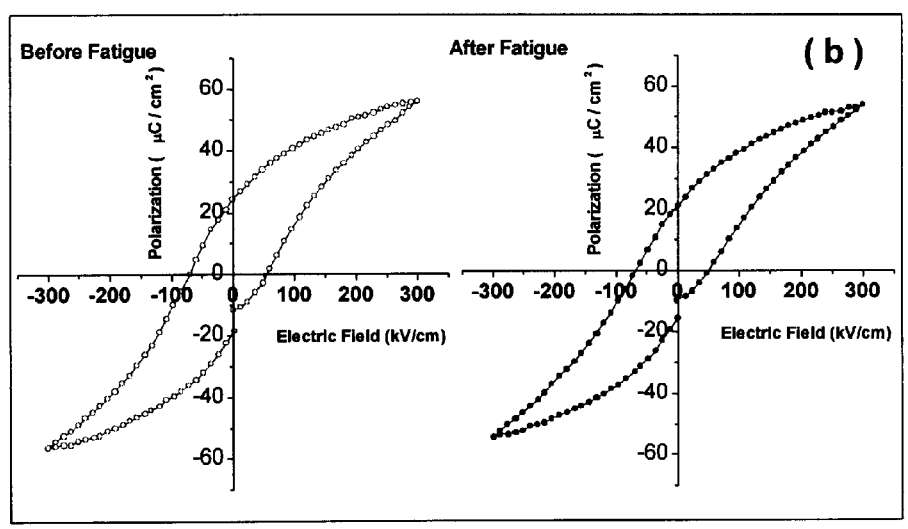

FIG. 3 is concerned with the fatigue characteristics of the SBT thin film: FIG. 3a shows that there is no difference in the characteristics until $1.0\times10^{11}$ cycles; FIG. 3b shows a comparison of a hysteresis curve before fatigue with a hysteresis curve after fatigue. The fatigue characteristics were measured by using bipolar square pulse at 6 volts with 1 MHZ. After $1.0 \times 10^{11}$ cycles, the residual polarity decreased at an amount of approximately 4%. This slight reduction has never been found in the conventional SBT thin films prepared at low temperatures.

A better understanding of the present invention may be obtained in light of the following examples which are set forth to illustrate, but are not to be construed to limit, the present invention

EXAMPLE I

After a chamber was de-pressurized to $10^{-3}$ torr, a substrate was heated up to 550° C. in the chamber. Bubblers for source materials, $Sr(C_5F_6HO_2)_2$, $Bi(C_6H_5)_3$ and $Ta(C_2H_5O)_5$, were heated to 120° C., 150° C. and 130° C. and the source materials were carried to the chamber by argon gas. At the same time, oxygen gas as reaction gas was charged in the chamber which was, then, maintained at an operating pressure enough to generate plasma. Under an RF power of 130 W, plasma was generated to deposit the source materials on the substrate. About 10–20 min after the deposition of the source materials, a valve was closed to stop the deposition. Thereafter, slow cooling the substrate within the chamber gave an SBT ferroelectric thin film.

EXAMPLE II

An SBT ferroelectric thin film was prepared in a similar manner to that of Example I, except for the bubbling temperatures of $Sr(C_5F_6HO_2)_2$, $Bi(C_6H_5)_3$ and $Ta(C_2H_5O)_5$ were 110° C., 140° C. and 120° C., respectively.

EXAMPLE III

An SBT ferroelectric thin film was prepared in a similar manner to that of Example I, except for the bubbling temperatures of $Sr(C_5F_6HO_2)_2$, $Bi(C_6H_5)_3$ and $Ta(C_2H_5O)_5$ were 130° C., 160° C. and 140° C., respectively.

As described hereinbefore, the method of the invention in which $Sr(C_5F_6HO_2)_2$, $Bi(C_6H_5)_3$ and $Ta(C_2H_5O)_5$ are used as the precursors for Sr, Bi and Ta, respectively and oxygen plasma evaporation is utilized, allows a crystalline SBT thin film to be formed at a temperature of about 550° C., the thin film being able to be applied for non-volatile memory devices by virtue of its characteristics of showing a residual polarity (Pr) of 15 $\mu C/cm^2$ or higher and a coercive electric field (Ec) of 50 kV/cm or less and of not showing a fatigue phenomenon until $1 \times 10^{11}$ cycles as measured under 6V bipolar square pulse in the structure comprising Pt upper and lower electrodes.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for forming an SBT ferroelectric thin film, comprising the steps of:

evaporating source materials comprising $Sr(C_5F_6HO_2)_2$, $Bi(C_6H_5)_3$, and $Ta(C_2H_5O)_5$;

carrying said source materials to a chamber by carrier gas;

charging a reaction gas in said chamber while maintaining said chamber at an operating pressure enough to generate plasma;

generating plasma by an RF power generator at an RF power of approximately 100–150 W to carry out deposit at a low temperature; and depositing said source materials on a substrate at a temperature of approximately 500–550° C.

2. A method in accordance with claim 1, wherein $Sr(C_5F_6HO_2)_2$, $Bi(C_6H_5)_3$, and $Ta(C_2H_5O)_5$ are evaporated at a temperature ranging from approximately 110 to 130° C., from approximately 140 to 160° C., and from approximately 120 to 140° C., respectively.

3. The method as set forth in claim 1, wherein:

said carrier gas is an argon gas.

4. The method as set forth in claim 1, wherein:

said reaction gas is an oxygen gas.

* * * * *